United States Patent [19]
Eloy

[11] Patent Number: 5,956,438
[45] Date of Patent: Sep. 21, 1999

[54] LASER-CONTROLLED PHOTOIONIC MICROHEAD APPARATUS

[75] Inventor: Jean-François Albert Eloy, Gradignan, France

[73] Assignee: Commissariat a l'Energie Atomique, Paris, France

[21] Appl. No.: 09/029,243

[22] PCT Filed: Sep. 6, 1996

[86] PCT No.: PCT/FR96/01371

§ 371 Date: Mar. 4, 1998

§ 102(e) Date: Mar. 4, 1998

[87] PCT Pub. No.: WO97/09461

PCT Pub. Date: Mar. 13, 1997

[30] Foreign Application Priority Data

Sep. 8, 1995 [FR] France ................................. 95 10544

[51] Int. Cl.⁶ ....................................................... G02B 6/26
[52] U.S. Cl. ........................ 385/15; 385/147; 219/121.6; 118/623
[58] Field of Search ................................ 385/15, 31, 147; 372/70; 219/121.6; 427/523; 118/623

[56] References Cited

U.S. PATENT DOCUMENTS

| | | | |
|---|---|---|---|
| 3,622,743 | 11/1971 | Muncheryan | 219/121.63 |
| 4,401,477 | 8/1983 | Clauer et al. | 148/4 |
| 4,714,628 | 12/1987 | Eloy | 427/53.1 |
| 4,752,455 | 6/1988 | Mayer | 427/53.1 |
| 5,760,362 | 6/1998 | Eloy | 219/121.6 |

FOREIGN PATENT DOCUMENTS 0390 525  10/1990  European Pat. Off. .

*Primary Examiner*—John D. Lee
*Assistant Examiner*—Juliana K. Kang
*Attorney, Agent, or Firm*—Oblon, Spivak, McClelland, Maier & Neustadt, P.C.

[57] ABSTRACT

A backup apparatus for an electronic circuit or part which is installed in a location where access is difficult. The apparatus includes a photoconnector that treats a component by a deposition of a material or by ionic implantation. The photoconnector includes a first light source for generating pulsed luminous energy and a first optical wave guide which has one end connected to the light source. A second light source is attached to the second end of the optical wave guide to receive the luminous energy emitted by the first source and transform it into a shockwave. At least one miniaturized photoionic head is associated with the second light source and diffuses the light supplied by the second light source. An automatic system controls emissions of luminous energy transmitted by the first light source along the optical wave guide.

5 Claims, 1 Drawing Sheet

LASER-CONTROLLED PHOTOIONIC MICROHEAD APPARATUS

BACKGROUND OF THE INVENTION

FIELD OF THE INVENTION

The invention relates to an automatically controlled photoionic microhead apparatus used for treating the surfaces of materials, in particular those of electronic circuits in order to repair them.

The invention has applications in the fields of electronics and microelectronics for the localized deposition of special coatings, restoring or eliminating functions from components of micro-circuits or producing new types of alloys for electrical connections.

In particular, the invention can be applied to repairing electronic circuits or components installed in locations where access is difficult such as hostile environments or space.

DISCUSSION OF THE BACKGROUND

It is known in the art that the composition of the surface of a material may be modified by adding matter or through implanting ions of certain chemical species.

To achieve this, materials treatment apparatuses have been designed in which miniaturized photoionic heads are used to modify the composition of the surface of a material. An example of a materials treatment apparatus with a miniaturized photoionic head is disclosed in FR-A-2 709 763.

In general, such materials treatment apparatuses comprise a photoionic head to which is connected the end of an optical fiber. At the other end of the fiber is fitted a power laser capable of emitting a pulsed laser beam. This power laser is associated with means of injecting the laser beam into the optical fiber. Generally speaking, the photoionic head is also associated with a source of pulsed light.

In the commonest current embodiments the pulsed light source and the photoionic head are combined to form a photoionic microhead stylus. This stylus is shown diagrammatically in FIG. 1.

FIG. 1 shows a diagram of the stylus fastened to an optical fiber 1. The entire length of optical fiber 1 is covered by an electrically conducting sheath 3 (for example, a plaited metal sheath) that covers the entire length of the optical sheath of fiber 1. Moreover, said conducting sheath 3 is itself covered by an electrically insulating sheath 5 that acts as a protective sheath.

Conducting sheath 3 has a dual function as the shielding for optical fiber 1 and the power supply that ensures correct operation of photoionic microhead 2. Insulating sheath 5 forms a leaktight seal around conducting sheath 3 and eliminates any electrical disturbance or breakdown that might disrupt the operation of the microhead.

The assembly composed of the optical fiber covered by conducting sheath 3 and insulating sheath 5 is referred to below as the optical wave guide and given the common reference 4.

A photoionic microhead 2 is fastened to optical fiber 1; the head comprises an electrically insulating confinement ring 7 whose external diameter is more or less equal to the external diameter of optical fiber 1. This confinement ring 7 is fastened to a first end of optical fiber 1. The confinement ring 7 is also designed to be placed against the surface of the material 6 to be treated. The confinement ring 7, whose inner surface is metallic, thus surrounds a zone Z of the surface of material 6. It is this zone Z that is treated.

This confinement ring is designed to apply the electric potential as required or not during the ionic implantation procedure as well as to direct the plasma within a limited space and to localize the interaction with the area localized and selected from zone Z of the surface of the material to be treated in order to induce photoconduction.

A thin film 9 made of the material to be projected onto zone Z of the surface of material 6 is placed inside said confinement ring 7.

In some embodiments thin film 9 is placed against the end surface of optical fiber 1. During treatment of zone Z it is this surface that is projected by shock wave onto the surface of material 6.

In other embodiments, particularly the embodiment shown in FIG. 1, an intermediate layer 11 is placed between the end of optical fiber 1 and thin film 9. Said intermediate layer 11 constitutes an optical impedance adapting layer that acts to reduce the optical index rate between the material composing optical fiber 1 and the material composing the thin film 9. This succession of thin films made of different layers ensures that a luminous power flux is delivered at the end of the microhead.

The operating principle of a photoionic head such as that described above is disclosed in FR-A-2 709 763 and will not be described in any more detail in the present application.

Furthermore, it is known that all electronic or microelectronic circuits are liable to accidental breakdown, often due to a malfunction of one of the components of the circuit. In some applications, particularly in aerospace or where the system is installed in locations where access is difficult, a faulty circuit may have serious consequences. It is therefore known in the art to double, even triple, one or more components of the electronic circuits. Thus if there is a fault in one of the circuits, the secondary or backup circuit takes over.

In general, if a fault occurs the backup circuit or circuits are activated by slaving systems remotely controlled by electromagnetic wave beams at preset frequencies.

This type of technology based on the duplication of circuits not only increases the bulk, but also production costs.

SUMMARY OF THE INVENTION

The invention aims to overcome precisely this drawback. It does this by disclosing an automatically controlled photoionic microhead apparatus that can be used to carry out remote repairs on one or more faulty components by deposition of material. The apparatus is automatically controlled by a laser source that provides virtually instantaneous launching of the backup procedure, i.e. the procedure designed to overcome the malfunction of the faulty circuit.

More precisely, the invention relates to a backup apparatus for an electronic circuit or part thereof installed in a location where access is difficult. The apparatus is characterized in that it consists of:

a photoconnector that treats an electronic circuit or part thereof by deposition of material or ionic implantation, said photoconnector comprising:
  a first light source capable of generating pulsed luminous energy,
  at least one optical wave guide, one end of which is attached to the first light source,
  at least one second light source attached to a second end of the optical wave guide to receive the luminous energy emitted by the first source and transform it into a shock wave, at least one miniaturized photoionic head associated with the second light source to diffuse the light supplied by the said second light source, and an automatic system for controlling emissions of the luminous energy transmitted by the first light source along the optical wave guide.

The automatic light emission control system advantageously includes:

means for injecting the luminous energy emitted by the first light source into the optical wave guide, electronic control means capable of delivering a control signal to the injection means, and means for slaving the injection means to said control signal.

According to the invention the luminous energy injection means include an optoelectronic component that either transmits the light to the optical wave guide or prevents it reaching the optical wave guide depending on the control signal received.

In one embodiment of the invention the first light source is a continuous source that emits permanent pulsed luminous energy.

In another embodiment the first light source is a non-continuous source whose emission of luminous energy is triggered by the control signal at the same time as the injection means are triggered.

In one variant, the apparatus comprises a plurality of photoionic heads all connected to a second light source that is itself connected to the automatic control system via an optical wave guide.

DISCUSSION OF THE PREFERRED EMBODIMENTS

Figure 2:
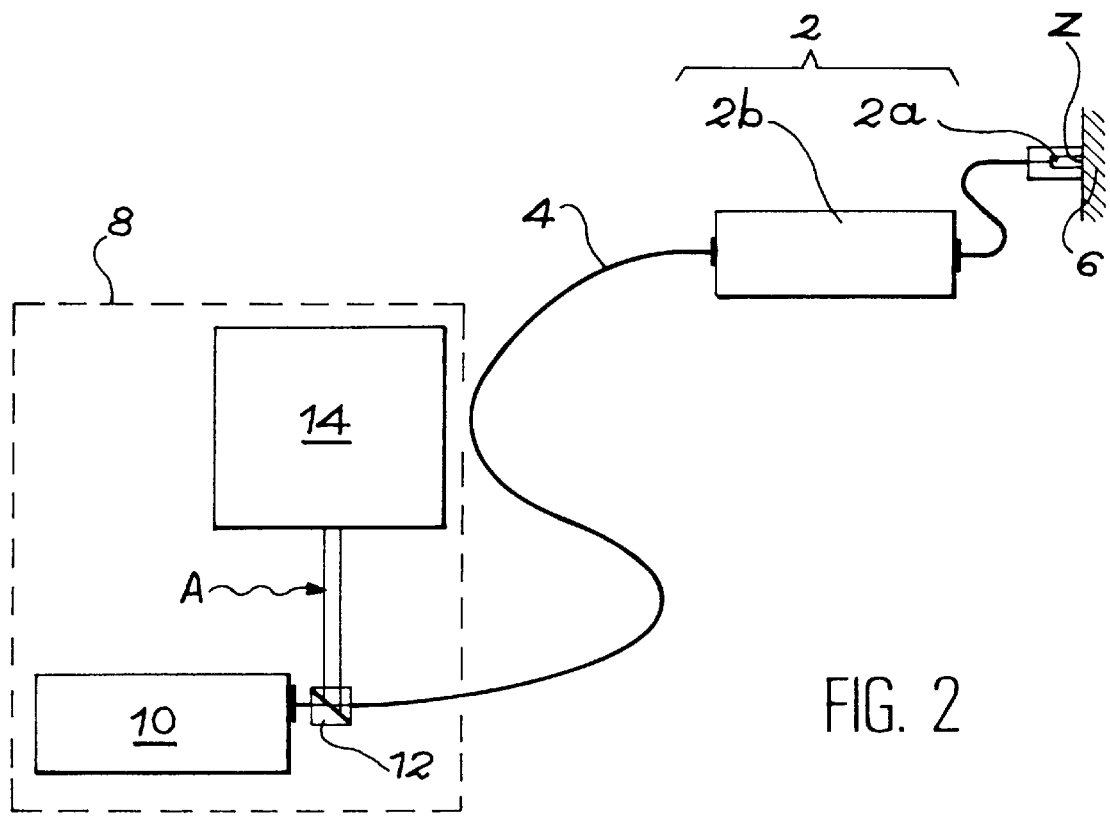
FIG. 2 is a diagrammatic representation of the circuit connecting the photoionic microhead of FIG. 1 to the automatic light emission control system of the invention.

FIG. 2 shows the apparatus of the invention with its photoconnector and automatic control system that, by depositing material or ionization, can mitigate a fault in an electronic circuit or part thereof, said part possibly being a component of the circuit.

The zone shown as Z in FIG. 2, represents the area of the faulty circuit to be repaired by means of depositing material or ionization.

Figure 1:
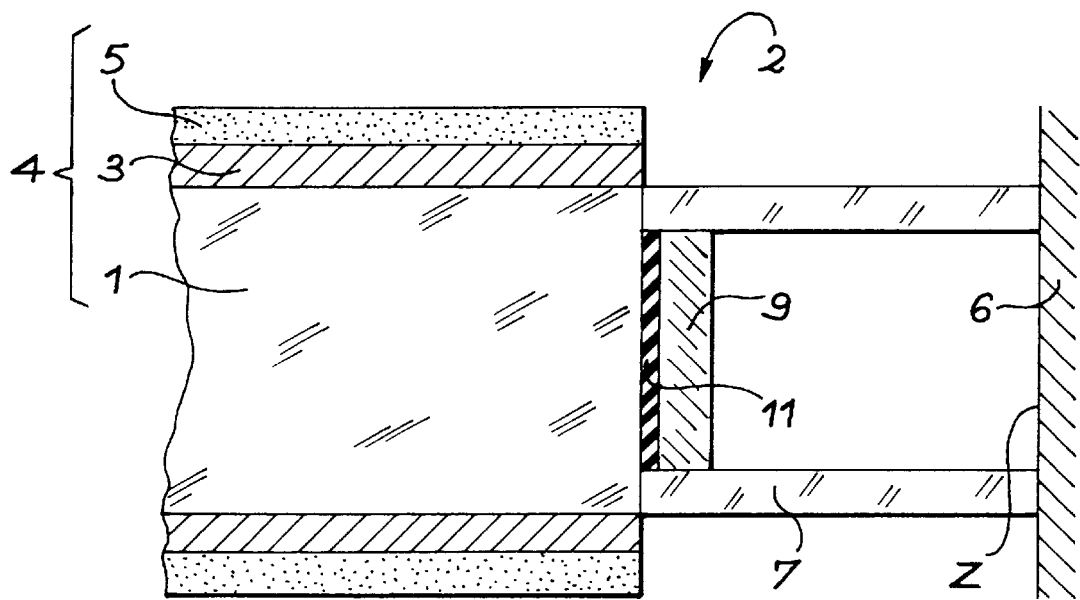
FIG. 1 (described above) is a diagrammatic representation of a photoionic microhead of the known art.

As can be seen in FIG. 2, the photoconnector comprises a miniaturized photoionic microhead 2 that is connected to the automatic control system via an optical wave guide 4 composed of an optical fiber 1 covered by a conducting sheath 3 that is itself covered by an insulating sheath 5, as explained in the description of FIG. 1.

Said photoionic microhead 2 may take the form of a stylus like that shown in FIG. 1. It may also take the form of a microhead 2a dissociated from light source 2b; in this configuration it is referred to as a "dissociated microhead", i.e. a microhead that is connected to light source 2b via an optical wave guide. It is this embodiment of the photoionic microhead that is shown diagrammatically in FIG. 2. The light source then has the reference 2a while the dissociated photoionic microhead assembly has the reference 2.

Light source 2b may be either a coherent or a non-coherent source. For example it may be a laser microchip or a laser diode. In particular it may be a laser microsource or pulsed microsource whose automatically- or electrically-triggered luminous flux has enough power to perform one of the following operations, depending on the embodiment:

either vaporize the thin film of solid material 9 previously deposited on the end of the optical wave guide 4 against the intermediate layer 11 and ionically implant it in zone Z of the surface of material 6 to be modified by implantation, i.e. on the component or circuit to be repaired, or impact directly on zone Z of the surface of material 6, i.e. the component or circuit to be repaired, in order directly to modify its physico-chemical and photoconductive properties.

Irrespective of the embodiment chosen of photoionic microhead 2, said microhead 2 is connected to the automatic control system 8 of the luminous energy emitted by the optical wave guide 4 described above.

In a variant of the invention (not shown in the Figure for the sake of simplicity) the apparatus includes several photoionic microheads 2 each connected by optical wave guide 4 to the automatic control system 8. In this configuration the group of microheads operate in parallel, i.e. they perform the same operations at the same time in different zones of material 6.

The automatic control system 8 of the luminous energy emission comprises a source of pulsed electric power 10 fitted with a unit for storing electric or electromagnetic power. Said power source 10 powers light source 2b. The electric power emitted by power source 10 is a beam of pulsed light that is transmitted to light source 2b via optical guide 4.

In a first variant of the invention, said pulsed electric power source 10 may be a source of continuous power, i.e. a power source that permanently emits a beam of pulsed light; it may, on the other hand, be a source of non-continuous electric power that only generates power on reception of a control signal.

Pulsed power source 10 is also called the pump source as it enables light source 2b to pump the luminous energy it requires to send a shock wave intended to cause modification of the surface properties of material 6. Pump source 10 may be a source of coherent light, i.e. it may be a power laser or laser diode; on the other hand, it may be a source of non-coherent light such as a flash of electromagnetic radiation.

The source itself is powered continuously by a power storage unit that may be built into the source itself, as shown in FIG. 2.

Automatic control system 8 also comprises an optoelectronic injection system 12 connected to a pulsed power source 10 and acting to conduct or inhibit the supply of electric power generated by power source 10 to optical wave guide 4. The decision to inhibit or conduct the electric power is determined by the control signals received by the optoelectronic system from a control signal generator system 14.

More precisely, optoelectronic system 12 comprises an optoelectronic component, for example a Pockel® cell, whose optical properties such as its refraction and extinction indices, can be instantaneously modified by applying an electric field or polarization. Said optoelectronic component also acts as an optical gate.

Pump source 10 is therefore a continuous source, for example a laser diode; triggering of the optoelectronic system 12 on reception of the triggering command transmitted by system 14 ensures that the power from pump source 10 is carried to optical wave guide 4, which amounts to saying that it opens an optical gate to allow injection of the pulsed electric power into optical wave guide 4. This type of continuous power source is described as a self-powered source.

If, however, the power source is non-continuous, when optoelectronic system 12 receives the trigger command it triggers power source 10 and opening of the optical gate.

More precisely, optoelectronic system 12 is triggered on reception of a command signal delivered by the control signal generator system 14. The signal emitted by the generator system 14 is thus a trigger signal, also known as the "TRIGGER", that launches a backup function, i.e. the injection of a luminous beam sent to microhead 2 so that it projects a layer of material on the section of circuit or the component to be treated.

For example, the control signal generator system 14 may comprise a differential amplifier with one input and several outputs. One of the signals transmitted by said generator system 14 may, for example, trigger pump source 10 (if the source is non-continuous) and the other signal transmitted by said generator system 14 may trigger the optoelectronic system 12.

The signal sent to the optoelectronic system 12 by generator system 14 may, for example, be optical, electromagnetic or electrical.

As will be seen from FIG. 2, optoelectronic system 12 and control signal generator system 14 have a double connection that allows for data to be exchanged between them. The data exchanged consists of the trigger command transmitted by generator system 14 to the optoelectronic system 12 and data indicating the status of the system. These data also include data from slaving system A. This system is shown in FIG. 2 by an arrow representing all the data concerning the status of the electronic circuit to be controlled and indicating whether a component or part of the circuit is malfunctioning. The data provided by said slaving system A is processed by the control signal generator system 14 which, depending on the data received, may or may not transmit a command triggering the optoelectronic system 12.

It will be understood that the apparatus of the invention is capable of operating independently; this means that it contains the power and backup information required to repair a faulty circuit. This type of apparatus may therefore be used in on-board applications.

The apparatus of the invention thus makes it possible, in remote mode and without any physical connection, rapidly to switch high currents, electric fields or high electric potentials with response times reaching $10^{-12}$ seconds (time calculated from arrival of the command to be executed).

More precisely, the apparatus of the invention may be described in terms of its operation, which is as follows:

continuous electrical supply of luminous pump source 10, in standby state, closure of optoelectronic gate 12, transmission by the control signal generator system 14 of a signal to trigger opening of optoelectronic gate 12, instantaneous opening of optoelectronic gate 12 with simultaneous triggering of pump source 10, where pump source 10 is a non-continuous source, with injection of the laser pump beam into optical wave guide 4, pumping by light source 2b of the power supplied by pump source 10.

This series of operations may be followed by two operating variants:

First variant: a laser pulse vaporizes the thin film of solid material 9 previously deposited on the end of the optical wave guide 4, followed by implanting of the chemical element constituting thin film 9 into target material 6 (part of the circuit or a component); finally, where such an effect is required, photoswitching induced by the impact of a second laser pulse on the chemically modified area of the material surface.

Second variant: the pump beam leaving microhead 2 has a direct impact on material 6 (part of the circuit or a component) in order directly to modify its photoconducting properties; this may therefore, in the case of an electronic component, cause photoswitching in a previously-installed special circuit designed for this purpose.

As has already been explained, the apparatus operates entirely independently since the electric signal activating the apparatus may be a signal resulting from an electrical or plasma malfunction. In particular, the apparatus according to the invention provides an instantaneous backup and flash-protection procedure for electronic components, microprocessors and computers against the effects of overload, high voltage and lightning such as breakdown of components in the solar panels of satellites in the ionospheric plasma.

It can also be used for remote flash-triggering of electric condensers, remote switching of electronic power gates, remote discharge of devices or insulators under accident circumstances, ultra-fast automatic protection of security devices with anti-intrusion locking. It can also be used to ensure synchronized destruction and locking of electronic functions.

I claim:

1. Backup apparatus for an electronic circuit or part thereof installed in a location where access is difficult, characterized in that it is activated by an electric signal resulting from a malfunction of the backed-up electronic circuit, and that it consists of:

a photoconnector that treats an electronic circuit or part thereof by deposition of material or ionic implantation, said photoconnector comprising:
      a first light source capable of generating pulsed luminous energy,
      at least one optical wave guide, one end of which is attached to the first light source,
      at least one second light source attached to a second end of the optical wave guide to receive the luminous energy emitted by the first source and transform it into a shock wave,
      at least one miniaturized photoionic head associated with the second light source to diffuse the light supplied by the said second light source, and
   an automatic system for controlling emissions of the luminous energy transmitted by the first light source along the optical wave guide and comprising:
      means for injecting the luminous energy emitted by the first light source into the optical wave guide,
      slaving means supplying data indicating the status of the electronic circuit to be backed up, and
      electronic control means which, depending on the data received by the slaving means, may or may not transmit a command triggering the injection means.

2. Apparatus of claim 1, wherein the luminous energy injection means include an optoelectronic component that either transmits the light to the optical wave guide or prevents it reaching the optical wave guide depending on the control signal received.

3. Apparatus of claim 1, wherein the first light source is a continuous source that emits permanent pulsed luminous energy.

4. Apparatus of claim 1, wherein the first light source is a non-continuous source whose emission of luminous energy is triggered by the control signal at the same time as the injection means are triggered.

5. Apparatus of claim 1, further comprising a plurality of photoionic heads all connected to a second light source that is itself connected to the automatic control system via an optical wave guide.

* * * * *